United States Patent [19]
Hughes et al.

[11] Patent Number: 5,884,486
[45] Date of Patent: Mar. 23, 1999

[54] THERMOELECTRIC HUMIDITY PUMP AND METHOD FOR DEHUMIDFYING OF AN ELECTRONIC APPARATUS

[75] Inventors: Richard Pierre Hughes, Kanata; Trevor George Zapach, Ottawa; Seaho Song, Kanata, all of Canada

[73] Assignee: Northern Telecom Limited, Montreal, Canada

[21] Appl. No.: 878,796

[22] Filed: Jun. 19, 1997

[51] Int. Cl.⁶ .............................. F25B 21/02; F25B 47/00
[52] U.S. Cl. .................................. 62/3.4; 62/279; 62/281
[58] Field of Search ................. 62/3.2, 3.3, 3.4, 62/3.6, 92, 279, 281

[56] References Cited

U.S. PATENT DOCUMENTS

| | | | |
|---|---|---|---|
| 2,970,449 | 2/1961 | Eichhorn | 62/279 |
| 3,651,660 | 3/1972 | Quiros | 62/279 |
| 4,321,800 | 3/1982 | Gifford, Jr. | 62/150 |
| 4,712,382 | 12/1987 | LeClear | 62/150 |
| 4,876,861 | 10/1989 | Tanaka et al. | 62/379 |
| 5,074,119 | 12/1991 | Anderson | 62/150 |
| 5,212,958 | 5/1993 | Anderson | 62/150 |
| 5,226,298 | 7/1993 | Yamamoto et al. | 62/3.4 |
| 5,375,421 | 12/1994 | Hsieh | 62/3.4 |
| 5,444,984 | 8/1995 | Carson | 62/3.4 |

FOREIGN PATENT DOCUMENTS

| | | | |
|---|---|---|---|
| 23647 | 3/1981 | Japan | 62/92 |
| 187538 | 11/1982 | Japan | 62/281 |
| 361082824 | 4/1986 | Japan | 62/3.4 |
| 180841 | 8/1986 | Japan | 62/279 |

*Primary Examiner*—William Doerrler
*Attorney, Agent, or Firm*—Angela C. de Wilton

[57] ABSTRACT

The invention relates to apparatus and method for efficiently removing humidity from a chamber. A thermoelectric cooler with a maintained temperature differential between the cool and warm sides of the cooler is used to condense the humidity from within the chamber upon the cool side of the cooler. The condensate is transferred to the warm side of the cooler and then removed through the capillary penetration into a porous structure of an evaporator at the warm side of the cooler and further evaporation. During evaporation, the condensate extracts heat from the warm side of the cooler, the temperature of the cool side of the cooler being also decreased, which results in an increase of the overall efficiency of the apparatus.

20 Claims, 4 Drawing Sheets

THERMOELECTRIC HUMIDITY PUMP AND METHOD FOR DEHUMIDFYING OF AN ELECTRONIC APPARATUS

BACKGROUND OF THE INVENTION

The present invention relates to an apparatus and method for efficiently removing humidity from inside a chamber.

A current trend in the telecommunications, electronics and other high-technology industries is to deploy an active electronic equipment into the outside environment. The electronic equipment is usually installed within a chamber housing electronic circuitry together with additional environmental equipment ensuring continuation in desired performance of the operational elements of the circuitry or equipment. More precisely, the additional environmental equipment comprises an apparatus to control humidity and temperature conditions to protect electronic components against deterioration in operation. Humidity is a significant factor contributing to the failure of active devices, especially when there is a need to operate at low temperatures. Moisture and condensation conditions do arise and may deleteriously affect circuitry elements or members such as electronic components upon printed circuit boards or may form electrical shorting bridges on printed circuit boards between circuit paths. Therefore the control of humidity in outside plant chambers is paramount to maintaining high reliability systems.

It is well known that dehumidifiers/humidity pumps may be designed by using thermoelectric coolers having, in operation, a cool side and a warm side with a maintained temperature differential between them, the cool side acting as a "cold spot" to condense vapour from the air. Prior art reveals numerous apparatus based on the thermoelectric coolers to remove excess moisture from chambers which otherwise causes damage to equipment or articles stored in the chambers. Most of them provide simple mechanical means and/or additional pumping for removing a liquid condensate from the chamber.

For example, U.S. Pat. No. 4,321,800 to Gifford, 1982 provides an apparatus for handling atmospheric condensate resulting from the operation of a dehumidifier structure wherein the container for the condensate is rocked, as the level of the condensate increases, by a shift in the centre of gravity of the container.

U.S. Pat. No. 5,375,421 to Hsieh, 1994 provides a portable thermoelectric dehumidifier suitable to dehumidify small chamber volumes and providing removal of the condensate through a drain valve connected with a hose or pipe for discharging the water outwardly.

U.S. Pat. Nos. 5,074,119, 1991 and 5,212,958, 1991 to Anderson provide a pump pack for automatic and continuous emptying of water condensate from a dehumidifier positioned below ground level or remotely from a gravity drain. Condensate collected in a water collection pan is withdrawn at a preselected water level by the pump and passes through the tubing to an elevated or remote drain means or to other appropriate areas for disposal.

In U.S. Pat. No. 4,712,382 to LeClear, 1986 the aforementioned problems are solved by usage of a dehumidifier with a low profile receptacle having operative components that discharge a liquid during operation. The receptacle includes an integral pivoting bar for allowing the receptacle to pivot from a first position to a second position in response to an accumulation of a predetermined amount of condensate, said actions being regulated by shutoff means for selectively energising said operative components.

All of the methods and apparatus for dehumidifying a chamber, described in the above prior art, utilise combinations of mechanical and electrical means to remove condensate from the chamber. Each of these apparatus requires the installation of additional equipment together with its disadvantageous periodic maintenance and the regular emptying of a condensate from a collection container.

The present invention seeks to provide apparatus and methods which will avoid the above problems.

SUMMARY OF THE INVENTION

It is therefore an object of the invention to provide an apparatus and methods for efficient dehumidifying of a chamber.

One aspect of the present invention provides a thermoelectric humidity pump having a sealed thermoelectric cooler with a maintained temperature differential between a cool and a warm side of the cooler, condensing means at the cool side of the cooler, condensate transfer means for transfer of the condensate from the cool side to the warm side of the cooler, and condensate evaporating means at the warm side of the cooler, comprising a porous evaporator to enable the condensate to penetrate into pores of the evaporator by capillary action and then be naturally evaporated. For evaporation of condensate to occur, heat is extracted from the warm side of the cooler, which leads to decrease of the temperature of the cool side of the cooler, the total efficiency of the apparatus being increased.

In one arrangement of the above humidity pump, the condensate transfer means has a passage forming a water trap between the cool and warm sides of the cooler with an outlet on the warm side and an inlet on the cool side of the cooler, a condensate holding trough interconnected with the passage outlet and having a condensate overflow which is at a lower position than the passage inlet. For maximising the degree of evaporation, the condensate evaporating means may be advantageously made in the form of a plurality of porous evaporating fins which are heat conductively connected to the warm side of the cooler and have lower ends extending into the trough to positions lower than the overflow. The fins preferably are made of sintered aluminium or other material providing a desired capillary action, thermal conductivity and corrosion resistance. Alternatively, the condensate evaporating means is unfinned and may be, for instance, a structure with a planar porous surface or corrugated surface. The condensing means preferably comprise a plurality of heat conductive fins which are heat conductively connected to the cool side of the cooler. Advantageously, these fins have lower ends disposed in a localised region above the passage inlet with the fins extending radially outwards to direct the condensate flow along the fins to the passage inlet. To enhance droplet formation the heat conductive fins may be covered with polytetrafluoroethylene (e.g. Teflon) or other low surface energy plastic. The condensing means may, however, merely comprise the surface of the cool side of the cooler. This arrangement is, of course, less efficient in forming condensate than a finned structure. To isolate the humidity pump from surrounding ambient air, a cover with a plurality of air vents is preferably extended over the warm side of the cooler and over the evaporating means, and the cover is preferably closed with a vapor permeable membrane impermeable to foreign matter, e.g. water and dust.

Another aspect of the invention provides an electronic apparatus having a housing defining a chamber, electronic components mounted within the chamber, and a thermoelectric humidity pump providing at least a part of a wall of the housing. The humidity pump has a sealed thermoelectric cooler with a cool side facing into the chamber and a warm side facing outwardly from the chamber, to maintain the temperature differential between the cool side and the warm side of the cooler. The pump also has condensing means at the cool side of the cooler and within the chamber, condensate transfer means for transfer of the condensate from the cool side and from within the chamber to the warm side of the cooler, and condensate evaporating means at the warm side of the cooler. The condensate evaporating means comprises a porous evaporator disposed to enable the condensate to penetrate into pores of the evaporator by capillary action and then be evaporated. The evaporator is heat conductively connected to the warm side of the cooler, and when evaporation of condensate occurs, heat is extracted from the warm side of the cooler. As a consequence, the temperature of the cool side of the cooler is also decreased, resulting in more efficient condensation of moisture within the chamber.

Yet another aspect of the invention provides a method of dehumidifying an electronic apparatus, based on usage of the thermoelectric cooler, and providing condensing moisture within the chamber upon a condensing means at a cool side of the cooler, transferring the condensate from the chamber, and removing the condensate by natural evaporation through the porous material of the condensate evaporating means at the warm side of the cooler, the condensate occupying the pores of the material by capillary action. The method not only provides a solution of the removal of the condensate from the chamber, but also utilises it to improve the efficiency of dehumidifying process.

BRIEF DESCRIPTION OF THE DRAWINGS

One embodiment of the invention will now be described, by way of example, with reference to the accompanying drawings in which.

DESCRIPTION OF THE PREFERRED EMBODIMENT

Figure 1:
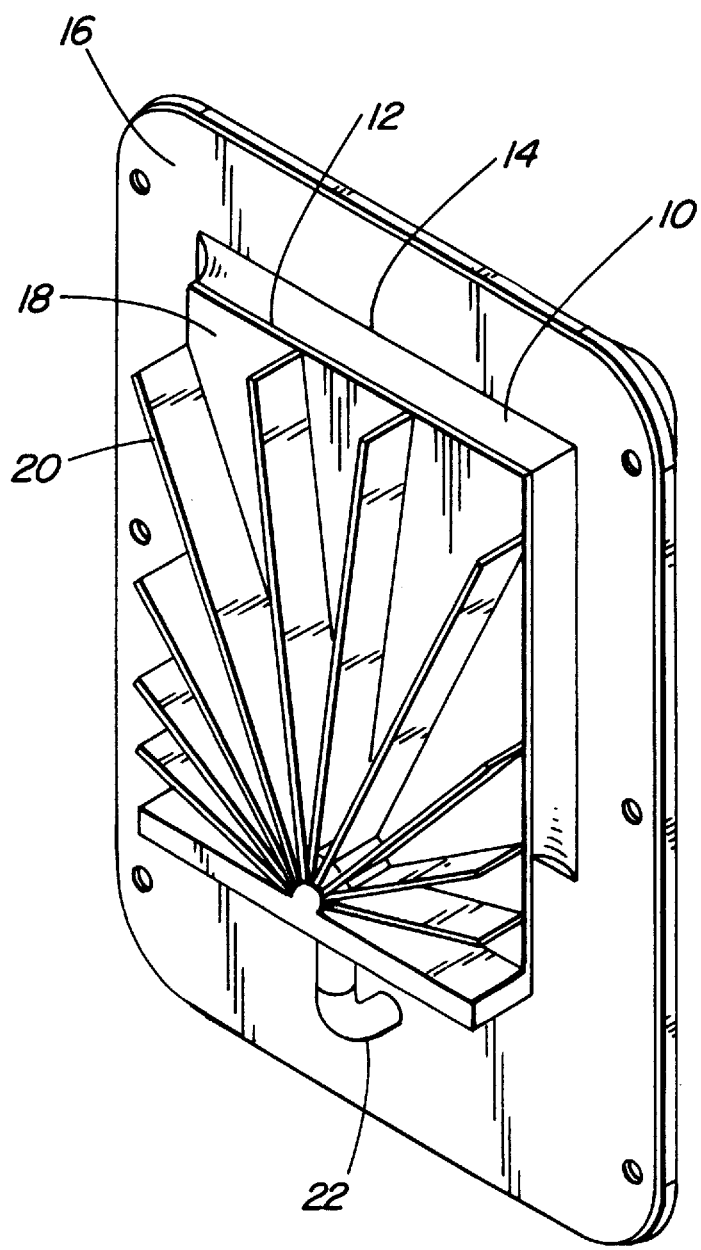
FIG. 1 is an isometric view of a cool side of a humidity pump according to the embodiment.
Figure 2:
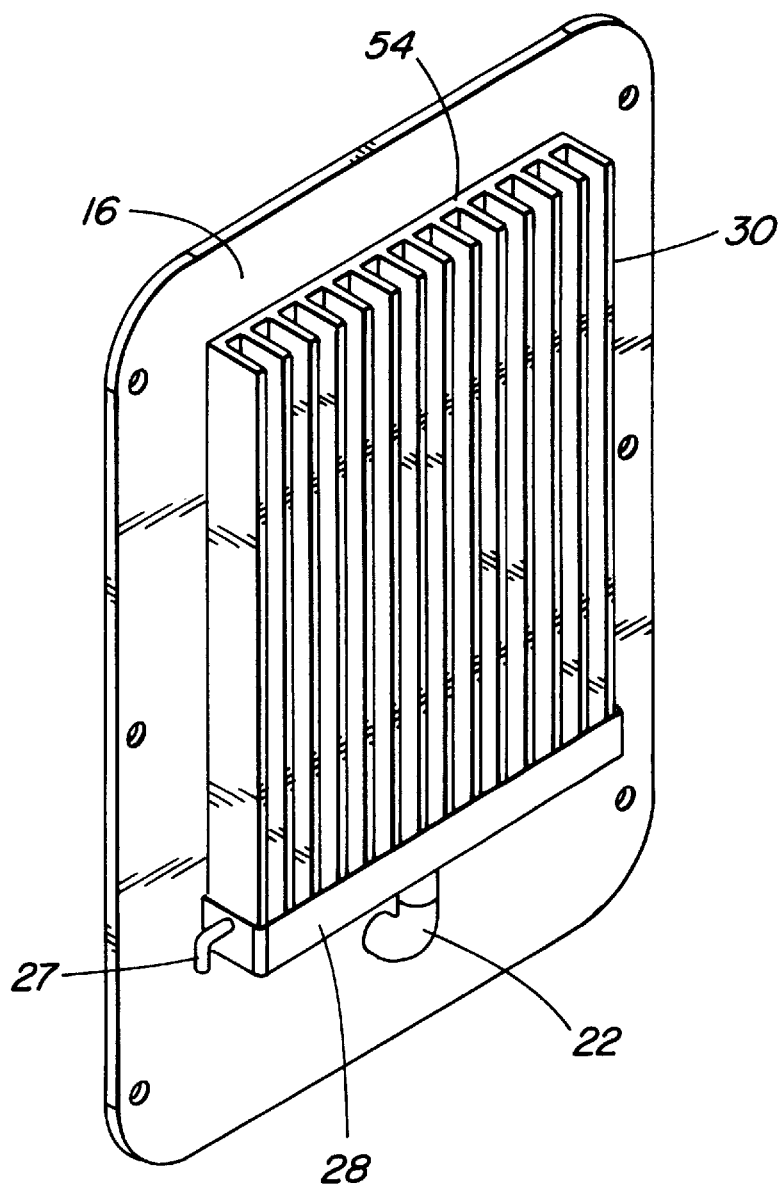
FIG. 2 is an isometric view of a warm side of the humidity pump of FIG. 1.
Figure 3:
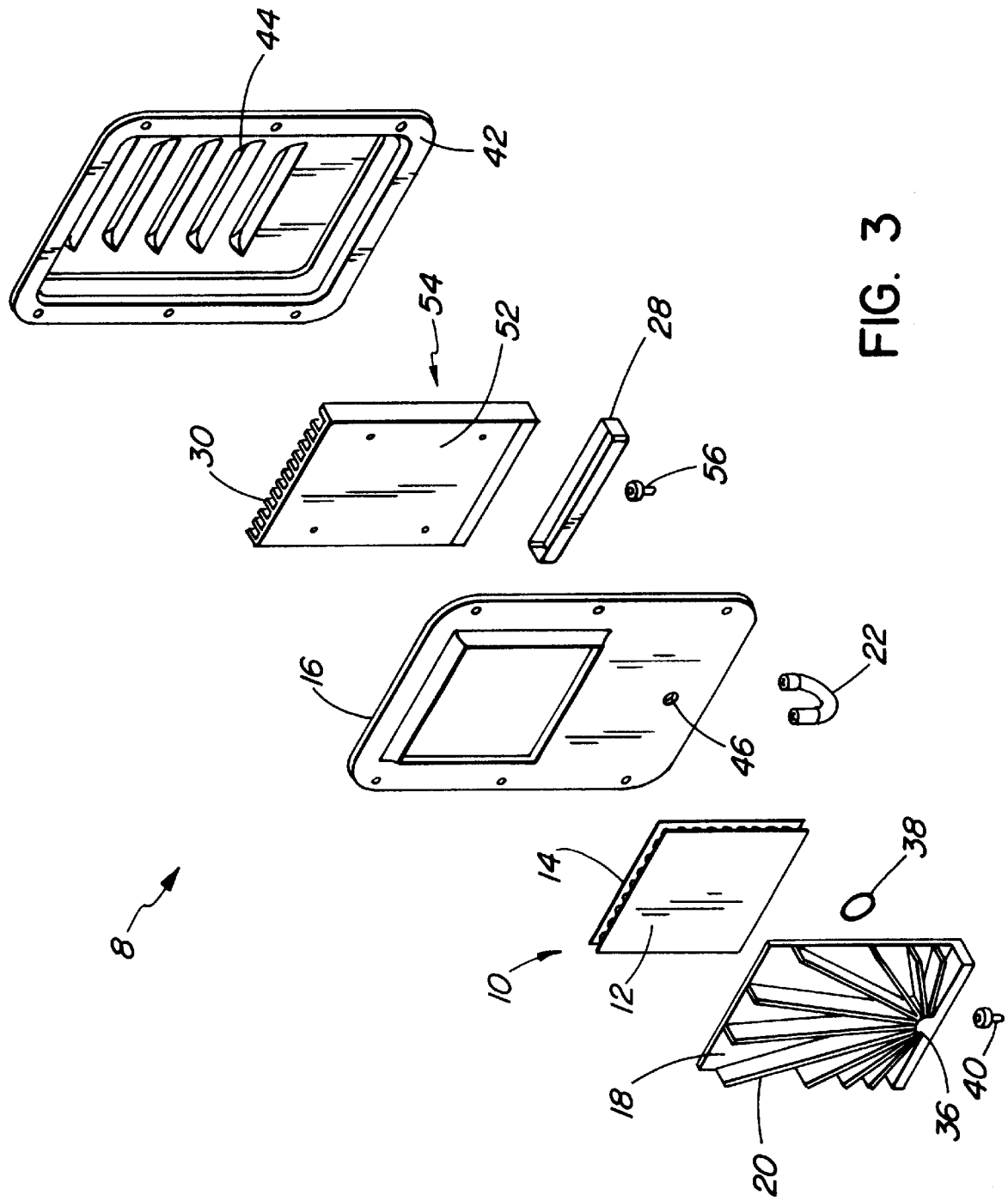
FIG. 3 is an exploded isometric view of the pump in the direction of figure.
Figure 4:
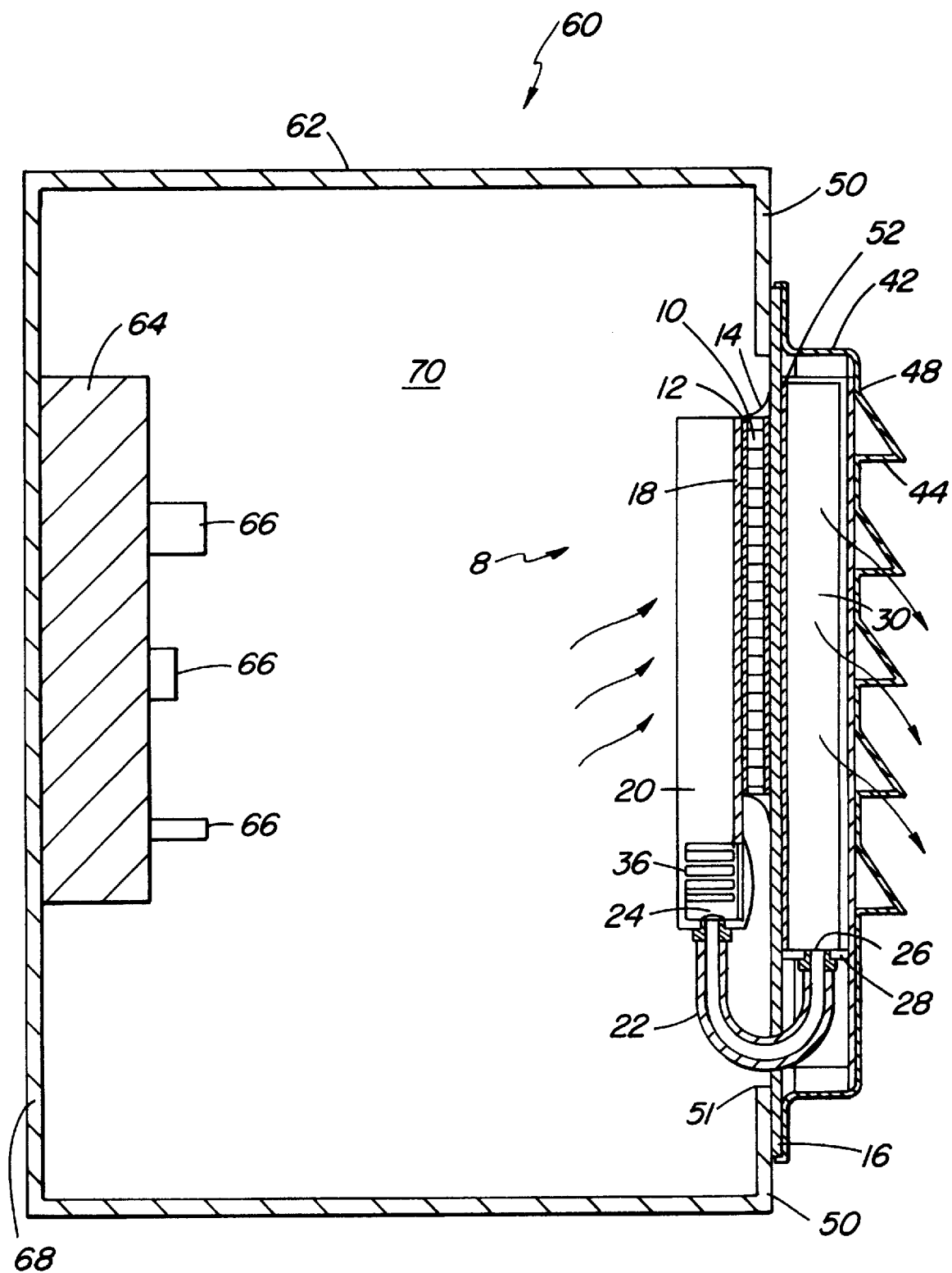
FIG. 4 is a vertical cross-sectional view of an electronic apparatus employing the humidity pump.

As shown in FIGS. 1–3, a thermoelectric humidity pump 8 comprises a thermoelectric cooler 10 formed as a thermopile by connecting in series a plurality of thermocouples in known manner, each thermocouple consisting of a p-type semiconductor and a n-type semiconductor electrically connected between two poles of a direct-current power supply to produce a "cool" junction and a "warm" junction respectively on a front side 12 and a rear side 14 of the thermoelectric cooler correspondingly, the cooler being operated from a power source (not shown) by electrical wiring (not shown). Thus, the thermoelectric cooler has, in operation, a cool front side 12 and a warm rear side 14, further referred to as a cool and a warm sides of the cooler correspondingly, with a maintained temperature differential between them. The cooler is fixed to a base heat conductive plate 16, usually made of aluminium or other metal/alloy with desired heat conductivity and anti-corrosion properties, and sealed from ambient atmosphere by caulking spaces between the walls of the cooler and the plate 16 with an appropriate material. The warm side 14 of the cooler is in heat conductive contact with the plate 16 (FIG. 4).

A condensing means is included and which are represented in FIGS. 1 and 3 by a condenser plate 18, preferably constructed from aluminium, and carrying a plurality of heat conductive condensing fins 20 assembled at the cool side of the cooler so as to provide a heat conductive connection with the cool side 12 of the cooler. The cooler also includes a condensate transfer means represented in FIGS. 1–3 by a passage forming a water trap 22, extending under the cooler from the cool side to the warm side of the cooler for transfer of condensate from the cool side to the warm side. The passage has an inlet 24 on the cool side of the cooler and an outlet 26 on the warm side of the cooler, the inlet being at a higher location than the outlet (shown in FIGS. 3 and 4). Lower ends of the fins 20 are disposed in a localised region above the passage inlet 24 with the fins 20 extending, in laterally spaced positions, radially outwards from the localised region to direct condensate flow along the fins 20 and to the passage inlet 24. A plastic plug 38 is used to cap a cavity 36 which is milled into the back of the condenser plate 18 and which cuts through the ends of the radial fins 20. The fins 20 are preferably coated with a low surface energy plastic, for example with polytetrafluorethylene (e.g. Teflon), thus allowing the water to bead up and drip into the cavity 36 which has an inlet hole into which a fitting 40 is inserted and the trap tube 22 is connected. The tube 22 passes through the base plate 16 via hole 46 and connects to another fitting 56 on the bottom of a condensate holding trough 28 thus providing a path for the water. The trough 28 is fixed to the warm side of the cooler with the holding trough interconnected with passage outlet 26 and having a condensate overflow 27 (shown in FIG. 4) which is at a lower position than the passage inlet 24.

Condensate evaporating means, which are represented in FIGS. 2 and 3 by an evaporator 54 is provided which comprises a plurality of porous evaporator fins 30 heat conductively attached to a planar plate 52. The evaporator 54 can preferably be made of sintered aluminium or other material providing desired capillary action, heat conductivity and anti-corrosion properties. Some porous or sintered ceramic materials may also be suitable. The plate 52 is, in turn, assembled onto the base plate 16 so as to provide a heat conductive connection with the warm side 14 of the cooler through the base plate. The fins 30 have lower ends which extend into the trough 28 to positions lower than the overflow 27.

To protect the humidity pump from a surrounding ambient air, a cover 42 with a plurality of vents 44 is extended over the evaporator 54 enabling moisturised air to pass out of the cover after evaporation. The vents 44 are closed with a vapour permeable membrane 48 (shown on FIG. 4) allowing the vapour to escape from within the pump and preventing water and dust from entering the pump. Preferably, the membrane is made of expanded polytetrafluoroethylene, e.g. GORE-TEX.

FIG. 4 illustrates an electronic apparatus 60 employing the humidity pump described above. The electronic apparatus 60 comprises a chamber 70 defined within a basically rectangular housing 62, having the thermoelectric humidity pump 8 providing at least a part of a wall 50 of the housing by the base plate 16 overlapping edges of an aperture 51 in the wall with the pump extending through the aperture. The pump 8 is oriented with its cool side 12 and fins 20 facing into the chamber 70 and the evaporator fins 30 facing outwardly from the housing and lying exteriorly thereof.

Electronic equipment, which is represented in FIG. 4 by electronic circuitry in the form of a printed circuit board 64, is mounted within the chamber 70 upon a wall 68 opposite to wall 50, the board carrying a plurality of electronic components 66. It is not essential that the electronic equipment be located at the wall 68. For instance, it may be mounted at any of the other walls comprising the housing 62 or somewhere inside the housing by use of specially designed mountings.

In operation, the thermoelectric cooler 10 ensures suitable temperature conditions within the chamber 70 to condense moisture from the air within the chamber upon the condenser fins 20 of the condenser plate 18. Due to gravity action, condensate flow is directed along the condenser fins 20 through the cavity 36 and into the passage inlet 24 at the cool side 12 of the cooler. While condensate is collected, it gradually fills the water trap tube 22 and the trough 28 at the warm side of the cooler, the filling of the trough 28 being ensured by its position being lower than the water inlet 24. With the condensate evaporator fins 30 having lower ends which extend into the trough 28 to positions lower than the overflow 27, condensate penetrates into pores of the fins 30 by capillary action, wicking up the porous structure and then evaporating. The resulting vapour is not able to re-enter the chamber 70 through the water filled water trap 22 and will escape through the permeable membrane 48 and out the vents 44 in the protective cover 42. During evaporation, and to aid in evaporation, heat is extracted from the warm side 14 of the cooler, thus decreasing its temperature. Therefore, due to the operational requirement of the cooler to maintain a constant temperature differential between the cool and the warm sides, lowering the temperature of the warm side 14 of the cooler via evaporation of condensate also lowers the temperature of the cool side 12 of the cooler. This results in more efficient condensation of moisture within the chamber 70 and an increase in the efficiency of the apparatus. The excess heat generated by the thermoelectric humidity pump 8 is conducted away to the walls of the chamber 70 via the base plate 16 and is also dissipated to the air via natural convention at the evaporating means 54. It should also be noted that when the water trap 22 is closed with condensate, the chamber 70 is environmentally sealed thereby preventing moisture in the ambient air from penetrating into the chamber.

Thus, not only the efficiency of the dehumidifying process is maximised, but the collected condensate is efficiently removed.

What is claimed is:

1. A thermoelectric humidity comprising:
   a sealed thermoelectric cooler having in operation, a cool side and a warm side with a maintained temperature differential between the cool side and the warm side;
   condensing means at the cool side of the cooler;
   condensate evaporating means at the warm side of the cooler; and
   condensate transfer means extending from the cool side to the warm side of the cooler for transfer of condensate from the cool side to the warm side of the cooler;
   the condensate transfer means comprising a passage forming a water trap between the cool and warm sides of the cooler, the passage having an outlet on the warm side of the cooler and an inlet on the cool side of the cooler, the pump also comprising a condensate holding trough on the warm side of the cooler with the holding trough interconnected with the passage outlet and with the holding trough having a condensate overflow which is at a lower position than the passage inlet, and the condensate evaporating means comprising a plurality of upwardly extending porous evaporator fins which are heat conductively connected to the warm side of the cooler and have lower ends which extend into the trough to positions lower than the overflow to enable condensate, which has been transferred to the warm side of the cooler, to penetrate into pores of the evaporator fins by capillary action, whereby for evaporation of condensate to occur, heat is extracted from the warm side of the cooler.

2. An electronic apparatus comprising:
   a housing defining a chamber;
   electronic components mounted within the chamber;
   a thermoelectric humidity pump providing at least a part of a wall of the housing, the humidity pump comprising:
   a) a sealed thermoelectric cooler having, in operation a cool side facing into the chamber and a warm side facing outwardly from the chamber and from the housing, with a maintained temperature differential between the cool side and the warm side;
   b) condensing means at the cool side of the cooler and within the chamber;
   c) condensate evaporating means at the warm side of the cooler; and
   d) condensate transfer means extending from the cool side to the warm side of the cooler for transfer of condensate from the cool side and from within the chamber to the warm side of the cooler;
   the condensate transfer means comprising:
   a passage forming a water trap between the cool and warm sides of the cooler, the passage having an outlet on the warm side of the cooler and an inlet on the cool side of the cooler, the pump also comprising a condensate holding trough on the warm side of the cooler with the holding trough interconnected with the passage outlet and with the holding trough having a condensate overflow which is at a lower position than the passage inlet, and the condensate evaporating means comprising:
   a plurality of upwardly extending porous evaporator fins which are heat conductively connected to the warm side of the cooler and have lower ends which extend into the trough to positions lower than the overflow to enable condensate, which has been transferred to the warm side of the cooler, to penetrate into pores of the evaporator fins by capillary action, whereby for evaporation of condensate to occur, heat is extracted from the warm side of the cooler.

3. A pump according to claim 1, wherein said porous evaporator fins are made of sintered aluminium.

4. A pump according to claim 1, wherein said porous evaporator fins are made of porous or sintered ceramic material.

5. A pump according to claim 1, wherein the condensing means comprises a plurality of heat conductive condensing fins which are heat conductively connected to the cool side of the cooler.

6. A pump according to claim 5, wherein the condensing fins have lower ends disposed in a localised region above the passage inlet with the fins extending, in laterally spaced positions, radially outwards from the localised region to direct condensate flow along the fins and to the passage inlet.

7. A pump according to claim 6, wherein said condensing fins are covered with a plastic material having surface energy lower than water.

8. A pump according to claim 7, wherein said plastic material is polytetrafluorethylene.

9. A pump according to claim 1, provided with a cover extending over the warm side of the cooler and over the evaporating means, the cover provided with a plurality of air vents to enable moisturised air to pass out of the cover after evaporate.

10. A pump according to claim 9, wherein the air vents are closed with a vapor permeable membrane, which is impermeable to foreign matter.

11. A pump according to claim 10, wherein said membrane is made of expanded polytetrafluoroethylene.

12. An electronic apparatus according to claim 2, wherein said porous evaporator fins are made of sintered aluminium.

13. An electronic apparatus according to claim 2, wherein said porous evaporator fins are made of porous or sintered ceramic material.

14. An electronic apparatus according to claim 2, wherein the condensing means comprises a plurality of heat conductive condensing fins which are heat conductively connected to the cool side of the cooler.

15. An electronic apparatus according to claim 14, wherein the condensing fins have lower ends disposed in a localised region above the passage inlet with the fins extending, in laterally spaced positions, radially outwards from the localised region to direct condensate flow along the fins and to the passage inlet.

16. An electronic apparatus according to claim 15, wherein said condensing fins are covered with a plastic material having surface energy lower than water.

17. An electronic apparatus according to claim 16, wherein said plastic material is polytetrafluorethylene.

18. An electronic apparatus according to claim 2, provided with a cover extending over the warm side of the cooler and over the evaporating means, the cover provided with a plurality of air vents to enable moisturised air to pass out of the cover after evaporation.

19. An electronic apparatus according to claim 18, wherein the air vents are closed with an vapor permeable membrane, which is impermeable to foreign matter.

20. An electronic apparatus according to claim 19, wherein said membrane is made of expanded polytetrafluoroethylene.

* * * * *